(12) United States Patent
Perner et al.

(10) Patent No.: US 7,349,253 B2
(45) Date of Patent: Mar. 25, 2008

(54) MEMORY DEVICE AND METHOD FOR TESTING MEMORY DEVICES WITH REPAIRABLE REDUNDANCY

(75) Inventors: Martin Perner, München (DE); Volker Kilian, München (DE)

(73) Assignee: Infineon Technologies AG, Munich (DE)

( * ) Notice: Subject to any disclaimer, the term of this patent is extended or adjusted under 35 U.S.C. 154(b) by 216 days.

(21) Appl. No.: 11/343,357

(22) Filed: Jan. 31, 2006

(65) Prior Publication Data

US 2006/0198215 A1     Sep. 7, 2006

(51) Int. Cl.
*G11C 11/34* (2006.01)

(52) U.S. Cl. .................. 365/185.09; 365/201; 365/200
(58) Field of Classification Search ........... 365/185.09, 365/201, 200

See application file for complete search history.

(56) References Cited

U.S. PATENT DOCUMENTS 5,841,709 A * 11/1998 McClure .................... 365/200

* cited by examiner

*Primary Examiner*—Anh Phung
*Assistant Examiner*—Nam Nguyen
(74) *Attorney, Agent, or Firm*—Dicke Billig & Czaja, PLLC

(57) ABSTRACT

A memory device and method for testing memory devices with repairable redundancy is disclosed. In one embodiment, both the regular memory area and the redundant memory area are subject to the same loads during manufacturing and test processes, and that at least one regular memory cell from a regular memory area and at least one redundant memory cell from a redundant memory area are connected with each other via a coupling circuit. The coupling circuit, in particular during the testing of the operability of the semiconductor memory device or of the memory cells, respectively, determines the state of the regular memory cell and/or the redundant memory cell. Thus, in tested and repaired semiconductor memory devices, so-called redundancy storage space for the repair of defective memory capacity can be provided for repair even in the last memory test step, including full test severity and fulfilling all and any reliability requirements for the repair of high-grade memory devices.

25 Claims, 3 Drawing Sheets

| d' | a | b | c | d |
|---|---|---|---|---|
| 0 | 0 | 0 | 0 | 0 |
| 0 | 1 | 0 | 1 | 1 |
| 0 | 0 | 1 | 1 | 1 |
| 0 | 1 | 1 | 0 | 0 |
| 1 | 0 | 0 | 0 | 1 |
| 1 | 1 | 0 | 1 | 1 |
| 1 | 0 | 1 | 1 | 1 |
| 1 | 1 | 1 | 0 | 1 |

MEMORY DEVICE AND METHOD FOR TESTING MEMORY DEVICES WITH REPAIRABLE REDUNDANCY

CROSS-REFERENCE TO RELATED APPLICATIONS

This Utility Patent Application claims priority to German Patent Application No. DE 10 2005 004 379.8, filed on Jan. 31, 2005, which is incorporated herein by reference.

FIELD OF THE INVENTION

The invention relates to a method for testing the operability of memory devices, in particular of DRAM semiconductor devices, making use of repairable redundancy. The invention further relates to a memory device with repairable redundancy for using the inventive method for testing memory devices.

BACKGROUND

An integrated memory device comprises a plurality of memory cells that are usually arranged in a matrix of electroconductive supply lines. The matrix of electroconductive supply lines is composed of column and row lines which are also referred to as word lines (WL) and bit lines (BL). The memory cells are each positioned at the crosspoints of the electroconductive supply lines that are connected with the memory cell via a top and a bottom electrode. To perform a change of the information content in a particular memory cell at the addressed crosspoint, or to recall the content of the memory cell, the corresponding word and bit lines are selected and impacted either with a write current or with a read current.

Different kinds of semiconductor memories are known, e.g., a RAM (Random Access Memory). A RAM memory device is a memory with optional access, i.e., data can be stored under a particular address and can be read out again under this address later. A particular kind of RAM semiconductor memories are DRAMs (Dynamic Random Access Memory) which comprise in general only one single, correspondingly controlled capacitive element per memory cell, e.g., a trench capacitor, with the capacity of which one bit each can be stored as charge.

The charge or the information stored, however, remains for a relatively short time only in a DRAM memory cell, so that a so-called "refresh" must be performed regularly, wherein the corresponding information content is written in the memory cell again or is refreshed, respectively. In contrast to DRAMs, no "refresh" has to be performed in the case of SRAMs (Static Random Access Memory) as long as the supply voltage is applied to the chip. In the case of non-volatile memory types such as EPROMs, EEPROMs, and flash memories, the stored data remain stored even if the supply voltage is switched off.

In the instant context, the term semiconductor memory device primarily designates semiconductor memory devices such as functional memory devices (PLAs, PALs, etc.) and table memory devices such as ROM or RAM semiconductor devices, e.g., SRAMs and DRAMs, but also logic semiconductor devices, i.e., integrated (analog or digital) computing circuits.

In semiconductor devices or memory chips, respectively, integrated circuits are established by numerous processes during the manufacturing, which are, for instance, in the case of logic semiconductor devices, capable of performing logic functions, i.e., of processing data in correspondence with predetermined operations, in particular pursuant to a programmed sequence. In a semiconductor memory device, e.g., a RAM semiconductor memory chip, a plurality of memory cells are integrated, in which, by selective applying of a voltage, electric charge can be stored or read out as an information unit (bit).

Usually, semiconductor devices are, in the course of the manufacturing process, in the semi-finished and/or finished state, prior to the incorporation in appropriate semiconductor modules, subject to extensive tests checking their functioning. By using appropriate test devices or analyzers, respectively, further tests may be performed after the incorporation of the semiconductor devices in the semiconductor modules (so-called module tests), so as to check the interaction of the individual semiconductor devices in the semiconductor module. Moreover, tests for analyzing defects may be required if a semiconductor module shows malfunctions after the assembly or during operation.

For the common manufacturing of a plurality of semiconductor devices, a so-called wafer (a thin disc manufactured of monocrystalline silicon) is used as a rule. For the structuring of the later circuits, the wafer is subject to a plurality of working processes, e.g., coating, exposure, etching, diffusion and implantation processes. After the termination of the working processes, the semiconductor devices are individualized by the wafer being sawn apart or scratched and broken, so that the individual semiconductor devices or chips are then available for further processing.

After the finishing of the semiconductor devices (i.e., after the performing of the above-mentioned wafer processing steps), the semiconductor devices are subject to test processes for checking their functioning at one or a plurality of (further) test stations. By means of appropriate test apparatuses, the devices—that are finished, but still positioned on the wafer—may also be tested in so-called disc tests. After the sawing apart (or the scratching and breaking, respectively) of the wafer, the devices—which are then available individually—are molded in a plastics mass and may subsequently be subject to further test processes at one or a plurality of test stations.

During the manufacturing of a semiconductor device, a silicon substrate is consequently manufactured first of all in so-called front end processes (FE processes), the silicon substrate comprising the desired memory cells or integrated circuits, respectively. After the finishing of the silicon substrates or chips, respectively, and their individualization, the electrical connections (e.g., contact pads) of the chips are connected (e.g., bonded) via electrical connecting lines (bond wires) with a contact frame so as to enable the electrical contacting of the silicon substrate with the periphery via external contacts (e.g., pins).

Subsequently, the chips connected with the contact frame are, as a rule, molded in a plastics package along with the contact frame, so that a packed semiconductor device is generated. A plurality of such semiconductor devices may then be composed to form a semiconductor module. Alternatively, it is also possible that a number of semiconductor devices is composed to form a semiconductor module even prior to the molding in separate plastics packages and is molded together in a common package subsequently only. The processes following the individualization of the semiconductor memory devices are referred to as back end processes (BE processes).

During the manufacturing of memory devices, diverse test steps are consequently performed in the manufacturing stages of the front end (FE), the back end (BE), during burn-in (BI), and at semiconductor memory modules. Some of these test methods serve to repair a memory device that is not fully operable, or to check it in conformity with specifications at a certain rate action. In the following, a way of processing that is common for most semiconductor memory products will be described, by means of which the disadvantages of the presently used redundancy repair concept of prior art is illustrated.

In the manufacturing stage of the front end, the memory device or memory chips on the wafer are tested exactly parallel and with a low access rate. In so doing, it is determined, in particular with DRAM memory devices, which of the memory cells has a sufficient margin or rate action, respectively, with respect to the retention requirements, and which memory cells may have to and can be replaced by redundant cells. If all and any defective memory cells can be masked out by an exchange with redundant word lines (WL) or bit lines (BL), a repairable memory device (repairable chip) is available.

The test process in the FE manufacturing stage comprises the testing in the so-called pre-fuse and post-fuse test step, in which defective column select lines (CSL) and word lines (WL) are detected before or after the repair is performed by means of fusing. The test process is, as a rule, performed at least at a particular test temperature, preferably at a high temperature HT, and optionally additionally also at a low temperature LT. The column select lines are control lines leading to a group of particular sense amplifiers (SA) that are selected during a row selection by means of the y-address of a memory cell. In the memory device, so-called redundant column select lines (RCSL) are provided which may be used in exchange for defective CSLs.

The redundancy information of each memory device or chip on the wafer collected in the pre-fuse test are subsequently burnt in irreversibly in a fuse process (by e-fuse or laser fuse), and the wafer is tested with respect to a successively performed repair. At this stage, both repaired and non-repairable chips are available on the wafer. Non-repairable chips are chips whose available redundancy is not sufficient to produce a fully operable and specification-consistent memory device with a defined memory size.

The chips or memory devices that have been tested and found to be fully operable (FE-pass-parts) are usually picked from the wafer and supplied to the back end manufacturing stage so as to mold them in a package. The packed semiconductor devices or memory chips are then stressed, burnt in and tested at high voltages and temperatures in a so-called burn-in process. Subsequently, the semiconductor devices are tested for their rate performance in the BE test at low and at high temperature (LT and HT). The memory devices that have been found to be operable in the BE test (BE-pass-parts) are provided for the construction of memory modules, wherein between 4 and 36 memory devices per module are used and tested again to sort out defective modules being the result of soldering. A defective module may, for instance, be produced by soldering degradation, which is caused by a reduction in quality due to the temperature-induced ageing of the chip during soldering.

Each test step is, as a rule, based on a so-called test severity, i.e. a specified functionality rate action exceeding the chip specification, for which any electric circuit or any memory cell field (array) of the DRAM memory device is examined with regard to particular causes of defect. Due to the adjustment and guaranty of this test severity, each test step entails a certain loss of yield which can continuously be optimized in the course of series-production readiness by means of test and process optimization. Although exclusively pass-parts are used in the last manufacturing step of the module construction, hard (retention) single cell defects occur due to soldering degradation, which may make the entire module fail in particular in the case of high temperature operation. Here it is, as a rule, the matter of few, frequently only one single, defective memory cell in the memory device.

The object of the so-called single bit repair is to eliminate such defects of single memory cells (single cell defects) in the memory device, which have occurred after the repair performed in the front end manufacturing stage. This is, for instance, done by providing a supplementary repair possibility on the component or module level of the memory device. It is presupposed that the single cells of the semiconductor memory which are provided for repair are adapted to be integrated as easily as possible and have already been subject to the necessary burn-in stress or do not require same. The (redundant) single cells of the semiconductor memory which are provided for repair must further be tested with respect to all test requirements (FE/BI/BE) in correspondence with the memory cells to be exchanged, or must already fulfill or be able to guarantee same.

The elimination of single cell defects on the module level is of great interest in particular in the case of memory devices with high memory density since the probability of a module failure increases with the number of memory devices contained, or with the chip number and with the memory density per chip, respectively. Nevertheless, the possibility of single memory cell repair, also of single components, is of advantage in particular in BI test or in BE test. During the burn-in test, retention defects that have been found at high temperature can be eliminated in that single cell defects are removed in a so-called BE cold test at low temperature or in a so-called BE hot test at high temperature. This way, the total BE-yield, i.e. the yield of functionally tested memory devices after the BE test can be improved.

A known possibility of repairing defective memory cells consists in providing DRAM memory cells for redundancy so as to use them in the case of a single bit repair and to thus increase the yield e.g. on the module level. This proceeding, however, entails the problems that redundant elements for the repair of single memory cell defects (single bit repair or single bit redundancy, SBR) or of a bit group still have to be available for a single access. Moreover, the knowledge of the test quality of the still available redundancy alone at the time of FE fusing is not sufficient to use the redundancy memory cells in later test steps, for instance, after the BI or the BE test. A replacement of defective memory cells by memory cells that have not been tested sufficiently severely would mean a generation of semiconductor memory devices or modules with a lower quality standard vis-à-vis non-repaired memory devices. Thus, the use of a non-tested redundancy with lower test severity would involve a potential failure risk. An additional testing of the repaired memory devices in the BI or the BE is not desirable for cost reasons.

The quality of free redundancies has to be known at any time of a test sequence without them having to be established anew later or having to be tested separately, since this would increase the test time. In the case of the BI, this could also result in an overstressing of the memory areas that have already been stressed. The redundancy elements must be accessible or addressable, respectively, so that they are also examinable. The redundancy memory cells must be tested or stressed along with the regular memory cells and possibly also be deactivated if a defect in the redundancy is detected.

For these and other reasons, there is a need for the present invention.

SUMMARY

The present invention provides a memory device and method for testing memory devices with repairable redundancy. In one embodiment, the method for testing the operability of a memory device, in particular a DRAM semiconductor memory device, including a control and a regular memory area having a number of regular memory cells, as well as a redundant memory area having a number of redundant memory cells, wherein the redundant memory cells serve to replace one or a plurality of defective memory cells from the regular memory areas includes coupling at least one regular memory cell from the regular memory area with at least one redundant memory cell from the redundant memory area via a coupling circuit, parallel or even loading of the regular memory area including the at least one regular memory cell along with the redundant memory area including the at least one redundant memory cell, e.g., by temperature, stress, and/or tension loads, parallel testing of the operability of the regular memory area including the at least one regular memory cell along with the redundant memory area including the at least one redundant memory cell, evaluation and case distinction on the basis of the result of the testing for operability, and deactivating of defective memory cells.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
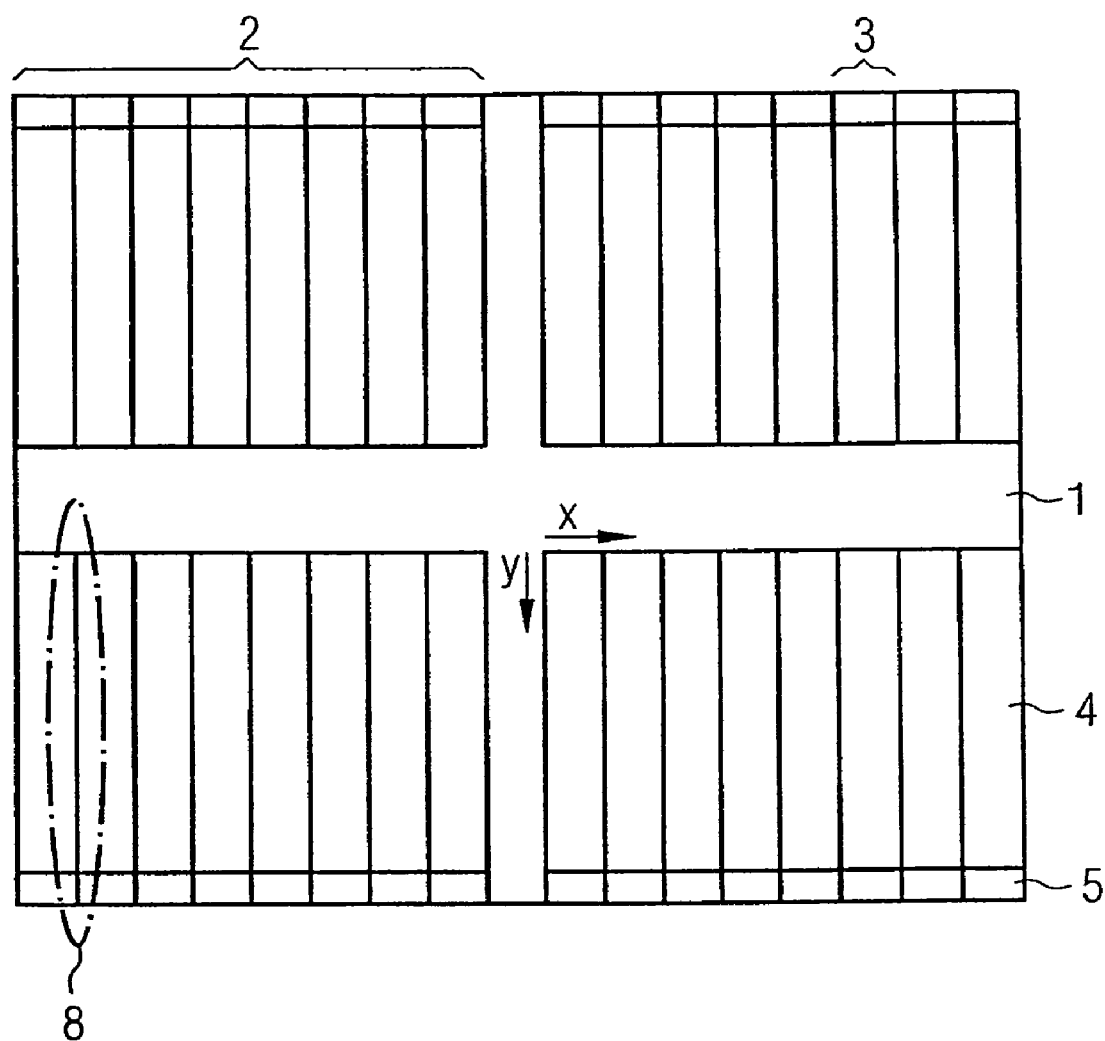
FIG. 1 a schematic representation of the structure of a semiconductor memory device with a plurality of arrays or memory cell fields, respectively, in accordance with a preferred embodiment of the present invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides in tested and repaired semiconductor memory devices, a so-called redundancy storage space for the repair of defective memory capacity of the semiconductor memory device, wherein the redundancy storage space can be used for repair even in the last memory examination process and has a full test severity and fulfils any requirements of reliability for the repair of qualitatively high-grade memory devices.

In one embodiment, the present invention provides a redundancy concept in which single defective memory cells are repaired by means of column redundancy having experienced the necessary test severity and the required memory cell stress and thus being adapted to be used for the defective memory cells without any quality loss for the semiconductor memory device.

The technical problem of providing the necessary redundancy with the required quality is consequently solved within the redundancy analysis in the pre-fuse, i.e. during a test process or a test sequence in the manufacturing stage of the front end FE in which defective column select lines (CSL) and word lines (WL) are detected, before the repair is performed by fusing. A selected redundancy and a regular memory row or memory column are repaired with the necessary priority to SBR redundancy, and these are jointly coupled to one another for the subsequent test processes, wherein the coupling exists for test purposes only. This may preferably be provided independently for each memory segment of the semiconductor memory device.

Due to the coupling of the selected redundancy, which is as close to the preferably repaired regular memory area as possible, it is possible, if no repair has been performed yet, to perform any stress and any examination due to the coupling in parallel implicitly at the redundancy and to thus minimize the test effort. In parallel to the testing it is determined whether a SBR redundancy can replace defective memory cells in further test processes, whether the SBR redundancy is still available or useless. This information can be utilized at the end of each test insertion or of a test process, respectively, or a sequence of test processes.

If, during testing, it is found that a column select line (CSL) is defective, the error addresses of the defective area stored during testing can, at the end of the test sequence, again be burnt in the semiconductor memory device to be repaired, e.g., by e-fuse, laser fuse, or soft fuse, whereby a reprogramming of the address supply line is achieved. The repair is preferably performed irreversibly with the above-mentioned redundancy being used which has also been tested due to the coupling to a regular memory device. This requires that the corresponding redundancy has not been used by that point in time and is additionally repairable, i.e., has been evaluated as "pass" during the test, and is preferably available independently for each memory segment of the semiconductor memory device.

A redundancy that is available in segments has the advantages that a potential multiple repair of defective memory cells is possibly by the use of a plurality of independent redundancies. Furthermore, it can be decided during pre-fuse already whether the providing of a SBR repair is possible for each segment individually due to the redundancy use calculated, which may possibly be postponed due to a consideration of the yield in the FE and in the BE manufacturing field and is introduced at a later time of series-production readiness only.

Further advantageous features of the inventive method are:

The providing of a redundancy that can be used at any time and whose quality with respect to the stress and the test severity experienced grows within the usual production processes of manufacturing and examination of the semiconductor memory device, without causing any additional test effort.

The local linking of selected column select lines (CSL) and redundant column select lines (RCSL) or word lines (WL) and redundant word lines (RWL), respectively, for the parallel testing and stressing of the BL or WL redundancy by means of a so-called pass/fail evaluation circuit.

The connecting of a pass/fail evaluation with the storing of the information about the repairability of the regular memory device or the redundant element, respectively, or the unique exchange of the two locally linked memory devices in the scope of a repair that can be performed at any time.

The storing of the repairability and of the repair status is preferably enabled by means of a fuse process, e.g. e-fuse, so that the potential SBR capability can be updated at any time of testing even in the packed state of the memory device.

FIG. 1 illustrates a schematic representation of the structure of a semiconductor memory device 1 according to one embodiment of the present invention. As explained above, the individual memory cells of semiconductor memory devices 1, in particular of DRAM memory devices, are arranged side by side in a plurality of rows and columns in a rectangular or square matrix or a rectangular or square memory cell field or memory cell array 2, respectively. In order to achieve a total memory capacity that is as high as possible, and/or a correspondingly high data read or data write rate, respectively, a plurality of, for instance four, individual arrays, so-called memory banks 2, may be provided in a RAM memory device or RAM memory chip (multi-bank chip) instead of one single array 2.

The memory cells in the array extend in x-direction and in y-direction, wherein the x-direction constitutes the word line area, i.e. that a particular memory cell within the array can be specified in x-direction by the word line address, and the y-direction constitutes the bit line area, i.e. that a particular memory cell within the array can be specified in y-direction by the bit line or column address. In order to perform a write or read access to a memory cell, a particular sequence of instructions in the semiconductor memory device 1 has to be observed. For instance, by means of a word line activate instruction (activate instruction), a corresponding word line (WL) that is assigned to a particular individual array (memory bank) 2 and that is defined by the row address is first of all activated. Subsequently, it is initiated by means of an appropriate read or write instruction that the data specified by the corresponding column address are output or read in, respectively. Each memory cell is equipped with a sense amplifier 8 that is designed as a so-called differential amplifier. The sense amplifier 8 senses the data content of the corresponding memory cell during a read access in that it senses the voltage difference between the two bit lines connected to the sense amplifier 8, amplifies same, keeps them ready and transmits them to the data bus in the case of an appropriate CSL selection or y-addressing.

To guarantee a faultless operation of the DRAM memory device, time conditions must also be observed in addition to particular sequences of instructions. In order to ensure this, control means (not illustrated) is provided which controls the signal processes in the semiconductor memory device. By means of the above-explained providing of a plurality of independent arrays (memory banks) in one single DRAM memory device, for each of which the control means generates corresponding word line activate and deactivate instructions, etc. independently in parallel, the delay times occurring during the writing or reading of data may be reduced, and the performance of the DRAM memory device 1 may thus be increased.

Each memory cell field or memory cell array 2 (memory bank) comprises a plurality of segments 3 in each of which a number of, for instance, 512 word lines is accommodated, which each control e.g. 2048 bit line pairs, wherein e.g. 512 memory cells are assigned to each bit line pair. As has already been mentioned above, each memory cell is connected with a sense amplifier arranged one below the other on the semiconductor substrate in a line 8 next to the memory cells. Each segment 3 is subdivided into two areas 4 and 5 of memory cells, wherein the area 4 comprises the regular memory cells and the area 5 the redundant memory cells. The redundant memory cells in the area 5 serve for the exchange or replacement, respectively, of regular memory cells from the area 4 which have been detected as defective (fail) during one of the above-mentioned function tests.

Figure 2:
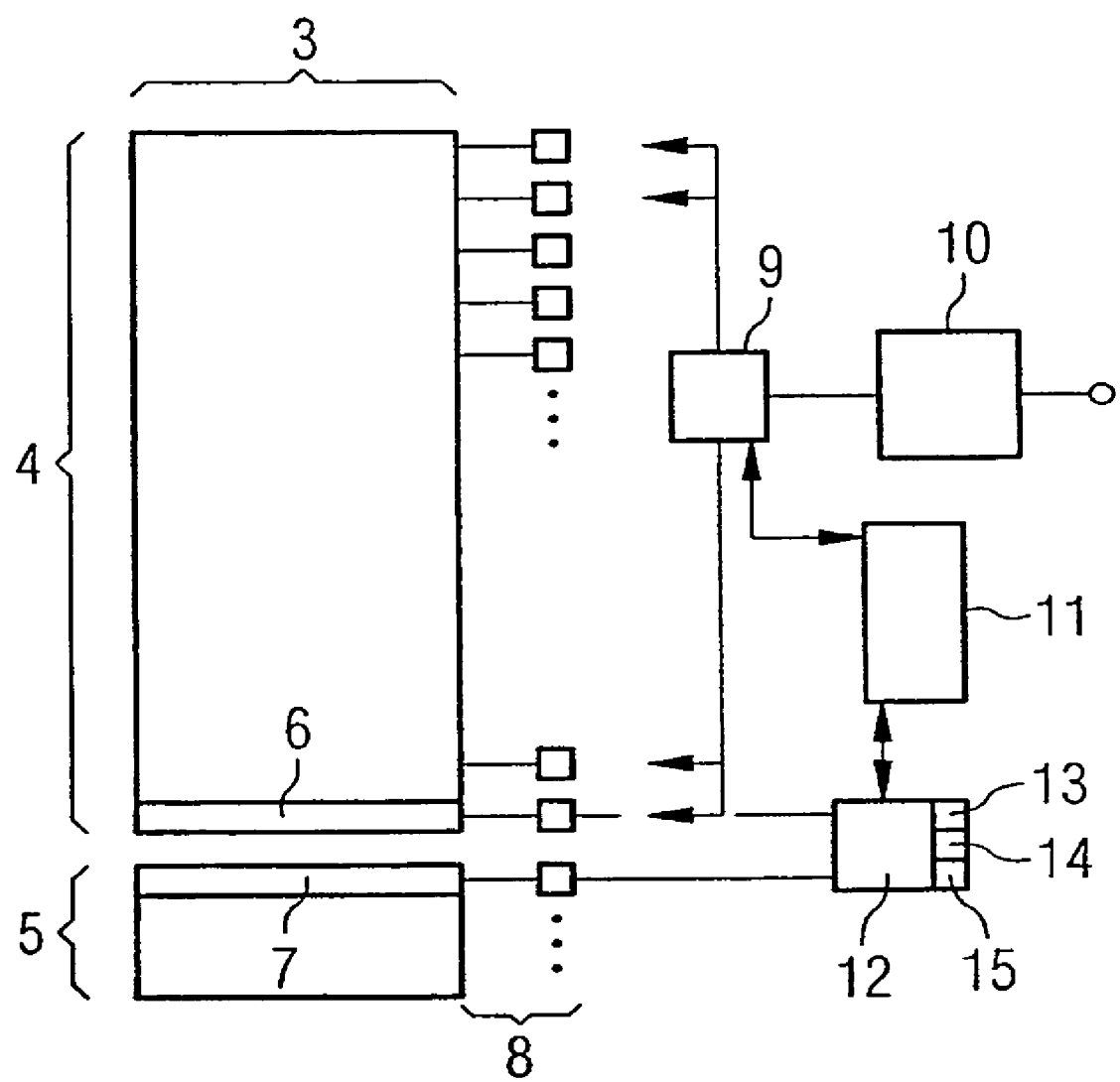
FIG. 2 a schematic representation of the structure of a segment of the semiconductor memory device illustrated in FIG. 1 with a control means and a coupling circuit or sticky-pass/fail-XOR circuit, respectively, for testing the function of a semiconductor memory device according to a preferred embodiment of the present invention.

FIG. 2 illustrates a schematic representation of the structure of a segment 3 of the memory device illustrated in FIG. 1. As has already been explained in the context of FIG. 1, the segment 3 comprises a number of memory cells which are each connected with a sense amplifier arranged one below the other in a line 8 next to the memory cells. The semiconductor memory device 1 is further equipped with control means to control the signal traffic to and from the individual memory cells in each segment 3.

The control means comprises, for instance, a multiplexer 9 connected with the respective sense amplifiers 8 and serving to select the data contents of the sense amplifiers 8. The multiplexer 9 is connected with a driver 10 which selects, by means of the y-address of an access instruction, which bits are to be read or written, and which further establishes the connection to the data bus (not illustrated). Moreover, the driver transmits the data or signals supplied by the multiplexer 9 from the corresponding memory cell to a tester (not illustrated). The tester finally determines by means of the signals supplied by the driver 10 during testing whether a memory cell in the area 4 of the segment 3 is operable (pass) or not operable (fail).

The segment 3 is subdivided into the two areas 4 and 5, wherein the area 4 comprises regular memory cells and the area 5 redundant memory cells (SBR redundancies). At the border between the areas 4 and 5 there are positioned two memory cells 6 and 7 side by side, i.e. the bottom regular memory cell 6 from the area 4 is adjacent to the top redundant memory cell 7 from the area 5. In accordance with a preferred embodiment of the present invention, the two adjacent memory cells 6 and 7 are connected with each other via their corresponding sense amplifiers 8 and a coupling circuit 12.

This coupling circuit 12 preferably comprises three marker bits 13, 14, and 15 which contain information about the state of the memory cells 6 and 7. By an appropriate read means, the data contents of the marker bits 13, 14, and 15 can be read, and thus the information about the state or the usability of the memory cells 6 and 7 can be taken. The marker bit 13 may, for instance, indicate a defect of one of the two memory cells 6 or 7 which has occurred within a test step (pass/fail marker); the marker bit 14 may, for instance, indicate that the memory cell 7 is already used as a redundant memory cell for a regular memory cell from the area 4 of the segment 3 (used marker); and the marker bit 15 indicates, for instance, whether the redundant memory cells in the area 5 of the segment 3 are operable or not (pass/fail marker). While the marker bit 13 can be re-written, the marker bits 14 and 15 can each be written once only. This way it is ensured that a defect that has once been detected during a test step, or the use of the redundant memory cells, respectively, is noted permanently. Thus, the information of whether the corresponding segment 3 of the semiconductor memory device 1 is ready for use, is repaired, or is irrepairable is also stored permanently in the marker bits 14 and 15.

If a process for testing the function of the semiconductor memory device 1 is performed, the test result or the information about the usability with respect to the memory cells 6 and 7 which are connected with each other by the coupling circuit 12 is stored in the marker bits 13, 14, and 15. This information can be transmitted to the multiplexer 9 via a further control element 11 for further utilization. If a function test reveals, for instance, that a regular memory cell in the area 4 is not operable (fail), but at least one redundant memory cell from the area 5 is operable (pass), the coupling circuit 12 and the control element 11 may transmit the corresponding address of the redundant memory cell from the area 5 to the multiplexer 9, so that the control of the semiconductor memory device uses the operable memory cell from the redundancy area 5 of the segment 3 instead of the defective memory cell from the regular area 4. Such a process is a so-called single bit repair (SBR) or single bit redundancy. The SBR process or the SBR device serves to repair only one defective memory cell or bit group for one single write or read access.

The area 5 with the redundant memory cells may also be positioned in a different segment 3 than the area 4 with the regular memory cells. FIG. 2 consequently shows the connection of the column select lines (CSL) and of the sense amplifiers 8 contained therein of two respective word lines in different segments 3 or of two column select lines (CSL) in one respective segment by a coupling circuit 12. In the embodiment of the present invention as illustrated in FIG. 2, the coupling circuit 12 is designed as a so-called sticky-pass/fail-XOR circuit which connects the equivalent sense amplifiers 8 of at least one regular memory cell and the sense amplifier 8 of at least one redundant memory cell with one another.

The coupling circuit 12 thus enables the joint writing and simultaneous evaluating of the redundancy 7 and of the regular memory area 4. Moreover, the coupling circuit 12 may, for instance, comprise an e-fuse memory serving for the segment-fine storage of the SBR use of the redundant area 5. An e-fuse memory may also be used for the segment-fine storage of the functionality of the used or non-used redundant area 5.

The providing and the testing of column select lines (CSL), i.e. control lines leading to a group of particular sense amplifiers (SA) which are selected with a particular row selection by means of the y-address of the write or read instruction, by redundant column select lines (RCSL) used in exchange for defective CSLs (CSL-SBR redundancy) can be effected in different ways. For instance, as FE test:

In the pre-fuse, the repair of the SBR memory area 5 and of the regular memory cell field adjacent to the SBR memory area 5 is, during the repair analysis, prioritized, accepting a yield reduction. When providing a CSL-based redundancy, a repair by means of word line redundancy is preferably performed. In the case of an impossible repair, the corresponding CSL-SBR redundancy of the corresponding area can be characterized as non-usable in the pre-fuse already.

The SBR memory 5 is segment-individually not used if it can be provided as a non-used and operable post-fuse-SBR redundancy.

Providing and testing of potential column select lines (CSL) as BI-/BE-/module test:

By means of a particular test mode it is decided in advance whether the test/stress is performed with memory cells of the SBR memory 5 that is coupled to a particular column select line (CSL).

The external pass/fail evaluation is performed in correspondence with the test result of the regular memory cell field 4. The regular memory cell field 4 then corresponds to a repaired memory cell field without SBR redundancy.

In accordance with a case distinction for a "pass" test result with which the operability of the regular memory area 4 is determined:

If the test result for the regular memory cell field 4 is "pass", it is evaluated at the end of a test with an activated parallel testing whether the redundancy 5 is still useable or operable, respectively.

If a defective SBR redundancy 7 is detected in the area 5, the defective SBR redundancy can be deactivated by test mode if it has not been deactivated yet. This process is permanently noted in the marker bit 15, so that the semiconductor device 1 is characterized as irrepairable.

The case distinctions as a function of the test result of the regular memory area 4, of the coupled regular memory area 6, and of the coupled redundant memory area 7 can be summarized in a table as follows:

| Case | Regular, repaired, uncoupled memory 4 | Regular coupled memory 6 | Redundant coupled memory 7 | Importance and decision for repair |
|---|---|---|---|---|
| 1 | Pass | Pass | Pass | No decision for repair necessary. SBR redundancy has the necessary test severity and need not be deactivated. |
| 2 | Pass | Pass | Fail | The test result of the semiconductor device is „pass", but a defect was detected by the comparison of the coupled memory area. Therefore, the SBR memory area has to be characterized as defective and has to be masked for a SBR repair, e.g. by a defect marker = 1. |

If a "fail" test result is determined in the regular memory cell field 4, the following further case distinctions may be performed:

If a test result is "fail" and the fail address is known, it is optionally determined at the end of the test by test mode that the corresponding memory device can be repaired. This, however, requires that the SBR redundancy 7 is pass or operable, respectively.

The difference to the afore-described case consists in that the regular memory area 6 coupled to the SBR memory has been determined as pass or operable, respectively, but the regular cell field 4 has been determined as fail or non-operable, respectively. In this case there is a memory defect that can be repaired with the redundancy available on the semiconductor memory device. By test mode, the error address may then be transmitted to a SBR address memory for subsequent repair. The repair merely takes place in the addressed memory segment itself (intrablock redundancy) and is performed only if the redundancy has been determined to be useable, i.e., if the corresponding marker bit 15 and the used marker 14 have been set correspondingly.

| Case | Regular, repaired, uncoupled memory 4 | Regular coupled memory 6 | Redundant coupled memory 7 | Importance and decision for repair |
|---|---|---|---|---|
| 3 | Pass | Fail | Pass | SBR repair would be possible, but SBR-CSL has repair potential. Usually, this case cannot be differentiated from case #4 in the test process. |
| 4 | Fail | Pass | Pass | The semiconductor device is detected as defective, in the coupled area no defect could be found, however, since all storages have been performed jointly. The redundancy can be used as SBR. (Only the very unlikely case that both in the memory area 6 and in the memory area 7 the same defect occurs with the same x-address has the same importance here. With the performance of the repair and a subsequent post-testing this case can, however, be examined. |
| 5 | Pass | Fail | Fail | In this case it is clear that the SBR-CSL memory has no more repair potential and that at least one defect exists in the regular cell field 4 which is not coupled with the defect in the SBR-CSL memory area 7. |
| 6 | Fail | Fail | Pass | The semiconductor device is irrepairable since there are at least two defects that cannot be repaired although the SBR memory area 7 is useable. |
| 7 | Fail | Pass | Fail | The semiconductor device is irrepairable since the SBR memory area 7 has been detected as defective and is masked out. |
| 8 | Fail | Fail | Fail | The semiconductor device is irrepairable since there are at least two defects that cannot be repaired; the SBR memory 7 is not useable, either. |

Figures 3, 4:
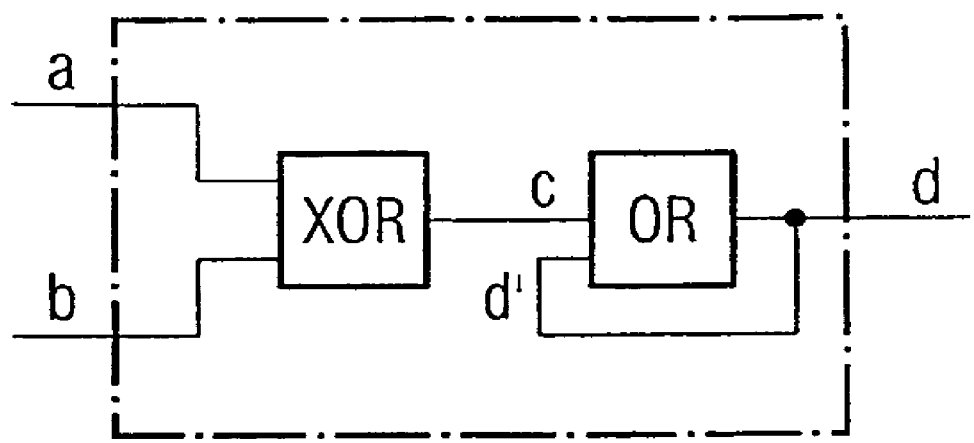
FIG. 3 a schematic representation of the structure of a sticky-pass/fail XOR circuit in detail for testing the function of a semiconductor memory device according to a preferred embodiment of the present invention.
FIG. 4 a table in which the logic results of the sticky-pass/fail-XOR circuit illustrated in FIG. 3 are represented.

According to a further embodiment of the present invention, the above-explained features of the inventive method may, for instance, be realized by the above-mentioned sticky-pass/fail-XOR circuit as a coupling circuit 12, as it is illustrated in FIG. 4. Such a sticky-pass/fail-XOR circuit 12 has the advantage of a simple and space-saving structure and is preferably integrated on the substrate of the semiconductor device 1. Via the sticky-pass/fail-XOR circuit 12, the sense amplifiers 8 of at least one regular memory cell 6 from the regular memory area 4 of the memory segment 3 are coupled with at least one redundant memory cell 7 from the redundant memory area 5 of the memory segment 3 in that the signals from the sense amplifiers 8 of the corresponding memory cells 6, 7 are supplied to the sticky-pass/fail-XOR circuit 12 via the inputs a and b.

The procedure of testing substantially consists of the writing of a known data content into the memory cell(s) to be tested and the subsequent reading of the data content out of the corresponding memory cells(s). The memory cell(s) is (are) detected as operable if the data content stored in the memory cell during writing is found again during reading. If the written data deviate from the data content read, the memory cell is not operable. In the present invention, the memory cells 6, 7 are preferably written in parallel with the same data content via the connections a and b for testing. During the subsequent reading, the data contents from the memory cells 6, 7 are called separately into the XOR circuit via the connections a and b. The coupling of the two memory cells 6, 7 consequently consists of the joint writing and the separate reading of the data contents via the XOR circuit of the coupling circuit 12.

The signal at the input a originates, for instance, from the sense amplifier 8 of at least one regular memory cell 6 from the regular memory area 4 while the signal at the input b originates from the sense amplifier 8 of at least one redundant memory cell 7 from the redundant memory area 5. The sticky-pass/fail-XOR circuit 12 comprises substantially a XOR circuit and an OR circuit, wherein the signals from the sense amplifiers 8 of the corresponding memory cells 6, 7 are first of all fed into the XOR circuit via the inputs a and b and are compared with one another there. The result of this comparison is transmitted via the output of the XOR circuit to the input c of the OR circuit. If the result of the XOR circuit has generated a high voltage level or a logic "1", respectively, this results also in a high voltage level or a logic "1", respectively, at the output d of the OR circuit.

By the feedback of the output signal of the OR circuit from the output d to the input d' of the OR circuit it is achieved that, due to a high voltage level or a logic "1", respectively, that has occurred once at the output of the XOR circuit or at the input d of the OR circuit, respectively, a permanent high voltage level or a logic "1", respectively, is caused at the output of the OR circuit and thus at the output of the sticky-pass/fail-XOR circuit 12. This way it is ensured that, due to a defect that has once been detected in a coupled memory cell 6 from the regular memory area 4 or in a coupled memory cell 7 from the redundant memory area 6 and that expresses itself, for instance, by a high voltage level or a logic "1", respectively, at the sense amplifier 8 of the corresponding memory cell, this result cannot be changed anymore.

FIG. 4 illustrates a table in which the logic results of the sticky-pass/fail-XOR circuit illustrated in FIG. 3 are represented. The result of the logic comparison of the signals from the sense amplifiers 8 of the coupled memory cells 6, 7 by the sticky-pass/fail-XOR circuit 12 is recorded in the above-described marker bits 13, 14, and 15 by corresponding data contents, for instance, a logic "0" for "pass" and a logic "1" for "fail".

When comparing two different states of the sense amplifiers 8, the sticky-pass/fail-XOR circuit 12 can consequently determine whether there is a difference in the values of the sense amplifiers 8 of the coupled memory cells 6 and 7. By the knowledge of the test result in the regular cell field 4, the state of the coupled SBR area 7 can then be gathered.

If more than one defect is detected in the regular memory cell field 4 during testing (wherein the actual number of defects and the address may be unknown), but the sticky bit result is "pass", a repair by the SBR memory 7 in the post-test might be without success since the coupled CSLs have synchronously stored the defect on the same x-address and y-address, or since more than two defects have occurred in the regular memory cell field 4, one of which could be repaired only.

In both cases, the memory device 1 is judged as fail or defective, so that the device is not processed in a non-repaired state, anyway. If a repair is to be performed even without knowledge of the success of repair, a post-test and an explicit post-test of the SBR memory area are necessary in both cases to find out definitely whether the repaired device is operable or not.

A first instant post-test without immediate SBR performance prior to the second instant post-test with immediate SBR performance may possibly clarify in the case of the confirmably defective memory devices whether the device defect ascertained only is an incidental contact defect. This way, it may, for instance, be defined that exclusively those semiconductor memory devices are subject to a SBR repair which have at least or exactly twice been judged as fail or defective in the post-test.

As has been explained above, by means of the inventive coupling circuit 12, a redundancy that has been provided in the course of the test process can be tested in parallel in the background during the testing of the regular memory cells, and be deactivated in the case of a defect. Due to the plurality of SBR redundancy that has been distributed segment-wise there is, even if a defect is detected only in one CSL, the possibility that the remaining free redundancies are used in the remaining segments as far as they have been reserved and are still "pass".

If, in the course of production, a defect is detected in the regular memory cell field 4 during manufacturing, the error address can, by means of a separate tester that has the possibility of logging the error address, be transmitted to the memory device by means of a test mode after the testing. A fuse command replaces at least one address in the segment that has been identified as defective, without knowing the functionality of the SBR redundancy.

Optionally, the error address may also be stored chip-internally in a self test, so that a re-writing of the error address is omitted and a chip-individual repair is enabled without expensive test methods and testers. This is of advantage in particular for modules with components that are operated in parallel, in particular if the memory components of the module are shielded off the tester by a defined, stringent, and thus inflexible, interface.

The repair step is performed similarly as in the case of a memory cell repair (SBR) by means of SRAM memory cells. The difference of the CSL-SBR to the SBR with a SRAM consists in that reliable SRAM cells are provided in the SRAM concept, which neither have to be stressed nor tested, and which can be replaced once. The repair is performed chip-individually with a defined amount of SRAM cells.

When using the method for the repair of defective memory cells by means of SRAM memory cells it must, however, be taken into account that:
  an SRAM memory has to be provided which cannot be used otherwise,
  the size of the SRAM memory cannot be adapted in the course of the series-production readiness, and
  the SRAM memory has a higher space requirement.

The advantages of the SRAM-SBR method, however, consists in that the SRAM memory need not be tested and stressed. The method for repairing defective memory cells by means of SRAM memory cells is both quicker and more reliable and does not require any specific test logic for simultaneous stressing and testing.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for testing the operability of a memory device, a DRAM semiconductor memory device, comprising a control and a regular memory area comprising a number of regular memory cells, as well as a redundant memory area comprising a number of redundant memory cells, wherein the redundant memory cells serve to replace one or a plurality of defective memory cells from the regular memory area; the method comprising:
  coupling at least one regular memory cell from the regular memory area with at least one redundant memory cell from the redundant memory area via a coupling circuit;
  parallel loading of the regular memory area including the at least one regular memory cell along with the redundant memory area including the at least one redundant memory cell;
  parallel testing of the operability of the regular memory area including the at least one regular memory cell along with the redundant memory area including the at least one redundant memory cell;
  evaluation and case distinction on the basis of the result of the testing for operability; and
  deactivating of defective memory cells.

2. The method according to claim 1, further comprising wherein during the coupling of a regular memory cell from the regular memory area with a redundant memory cell from the redundant memory area two adjacent memory cells are coupled with each other via the coupling circuit.

3. The method of claim 1, further comprising wherein on the basis of the result of the testing for operability, one or a plurality of defective memory cells from the regular memory area are replaced by one or a plurality of redundant memory cells from the redundant memory area.

4. The method according to claim 1, further comprising wherein on the basis of the result of the testing for operability performing, case distinctions for whether the regular memory area comprises one or a plurality of defective memory cells, whether the redundant memory area comprises one or a plurality of defective memory cells, and/or whether the memory device is repairable or not.

5. The method according to claim 1, further comprising wherein, for replacing one or a plurality of defective memory cells from the regular memory area by one or a plurality of redundant memory cells from the redundant memory area by means of the control of the memory device, an error address or memory address, respectively, of a defective memory cell is replaced by a memory address of an operable memory cell from the redundant memory area.

6. The method according to claim 1, further comprising wherein a fuse command in a segment of the memory device which has been identified as defective replaces at least one error address or memory address, respectively, of a defective memory cell.

7. The method according to claim 1, further comprising wherein, for testing the operability, a self test is performed in the memory device, wherein the error addresses are stored in the memory device.

8. The method according to claim 1, further comprising wherein first of all the operability of the regular memory area is tested, subsequently the operability of the regular memory area including the at least one regular memory cell is tested along with the redundant memory area including the at least one redundant memory cell, and the state or the usability, respectively, of the coupled memory cells is determined from the comparison of the test results.

9. The method according to claim 1, further comprising wherein the testing is performed by means of a test device that is adapted to determine error addresses of defective memory cells of the memory areas, and that, after testing, at least one error address is transmitted from the test device to the memory device, preferably by means of a test mode.

10. The method according to claim 1, comprising wherein for testing the memory cells, equal data contents are preferably written in parallel into the memory cells and are subsequently read separately via the coupling circuit.

11. A memory device comprising:
a control and a regular memory area comprising a number of regular memory cells;
a redundant memory area comprising a number of redundant memory cells, wherein the redundant memory cells serve to replace one or a plurality of defective memory cells from the regular memory area;
wherein both the regular memory area and the redundant memory area were subject substantially to the same loads during manufacturing and test processes, and that at least one regular memory cell from the regular memory area and at least one redundant memory cell from the redundant memory area are connected with each other via a coupling circuit, wherein, in particular during the testing of the operability of the memory device or the memory cells, respectively, the state of the regular memory cell and/or of the redundant memory cell can be determined via the coupling circuit.

12. The memory device according to claim 11, comprising wherein the memory cells are connected with the coupling circuit via their sense amplifiers and the memory cells are arranged adjacently preferably on a semiconductor substrate.

13. The memory device according to claim 11, comprising wherein information about the state of the memory cells is stored in the coupling circuit in particular during or after the testing of the operability of the memory device.

14. The memory device according to claim 11, comprising wherein the coupling circuit comprises a number of marker bits containing information about the state or the usability, respectively, of the memory cells in the regular memory area and/or in the redundant memory area.

15. The memory device according to claim 11, comprising wherein the data contents or information, respectively, about the usability of the memory cells contained in the marker bits are preferably readable and/or writeable via the control of the memory device and/or via an external read means, e.g. an external test device.

16. The memory device according claim 11, comprising wherein the coupling circuit is designed to transmit information about the state of the memory cells to the control of the memory device and/or to an external test device.

17. The memory device according to claim 11, comprising wherein the control of the memory device replaces, on the basis of the information about the state of the memory cells supplied by the coupling circuit, a defective memory cell from the regular area by an operable memory cell from the redundant area.

18. The memory device according to claim 11, comprising wherein the coupling circuit that is preferably integrated on the memory device comprises two inputs and one output and is designed such that a high voltage level or a logic "1", respectively, that has once occurred either at the first input or at the second input causes a permanent high voltage level or a logic "1", respectively, at the output of the coupling circuit.

19. The memory device according to claim 11, comprising wherein the coupling circuit comprises a sticky-pass/fail-XOR circuit that comprises substantially a XOR circuit and an OR circuit, so that signals from the coupled memory cells are fed into the XOR circuit via the inputs and are compared with one another there, and the result of the comparison is transmitted from the XOR circuit to a first input of the OR circuit whose output is connected with the second input of the OR circuit.

20. The memory device according to claim 11, comprising wherein the first input of the coupling circuit is connected with the sense amplifier of a regular memory cell from the regular memory area and the second input of the coupling circuit with the sense amplifier of a redundant memory cell from the redundant memory area, or vice versa.

21. A system with a memory device according to claim 11.

22. A method for testing a DRAM semiconductor memory device, comprising a control and a regular memory area comprising a number of DRAM regular memory cells, as well as a redundant memory area comprising a number of redundant memory cells, wherein the redundant DRAM memory cells serve to replace one or a plurality of defective memory cells from the regular memory area, the method comprising:
coupling at least one regular DRAM memory cell from the regular memory area with at least one redundant DRAM memory cell from the redundant memory area via a coupling circuit;
even loading of the regular memory area including the at least one regular DRAM memory cell along with the redundant memory area including the at least one redundant DRAM memory cell;
parallel testing of the operability of the regular DRAM memory area including the at least one regular memory cell along with the redundant memory area including the at least one redundant DRAM memory cell;
evaluation and case distinction on the basis of the result of the testing for operability; and
deactivating of defective memory cells.

23. The method according to claim 1, further comprising wherein during the coupling of a regular DRAM memory cell from the regular memory area with a redundant DRAM memory cell from the redundant memory area two adjacent DRAM memory cells are coupled with each other via the coupling circuit.

24. The method according to claim 23, further comprising wherein, for replacing one or a plurality of defective memory cells from the regular memory area by one or a plurality of redundant DRAM memory cells from the redundant memory area by means of the control of the memory device, an error address or memory address, respectively, of a defective memory cell is replaced by a memory address of an operable memory cell from the redundant memory area.

25. A system for testing the operability of a memory device, a DRAM semiconductor memory device, comprising a control and a regular memory area comprising a number of regular memory cells, as well as a redundant memory area comprising a number of redundant memory cells, wherein the redundant memory cells serve to replace one or a plurality of defective memory cells from the regular memory area, the system comprising:

means for coupling at least one regular memory cell from the regular memory area with at least one redundant memory cell from the redundant memory area via a coupling circuit;

means for parallel loading of the regular memory area including the at least one regular memory cell along with the redundant memory area including the at least one redundant memory cell;

means for parallel testing of the operability of the regular memory area including the at least one regular memory cell along with the redundant memory area including the at least one redundant memory cell;

means for evaluation and case distinction on the basis of the result of the testing for operability; and means for deactivating of defective memory cells.

* * * * *